(12) United States Patent
Popp et al.

(10) Patent No.: US 10,147,904 B2
(45) Date of Patent: Dec. 4, 2018

(54) ORGANIC OPTOELECTRONIC COMPONENT

(71) Applicant: OSRAM OLED GmbH, Regensburg (DE)

(72) Inventors: Michael Popp, Freising (DE); Richard Baisl, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 34 days.

(21) Appl. No.: 14/916,560

(22) PCT Filed: Sep. 2, 2014

(86) PCT No.: PCT/EP2014/068610
§ 371 (c)(1),
(2) Date: Mar. 3, 2016

(87) PCT Pub. No.: WO2015/032750
PCT Pub. Date: Mar. 12, 2015

(65) Prior Publication Data
US 2016/0204378 A1 Jul. 14, 2016

(30) Foreign Application Priority Data
Sep. 4, 2013 (DE) .................... 10 2013 109 646

(51) Int. Cl.
*H01L 51/52* (2006.01)
*H01L 51/10* (2006.01)
*H01L 51/50* (2006.01)

(52) U.S. Cl.
CPC ........ *H01L 51/5253* (2013.01); *H01L 51/107* (2013.01); *H01L 51/5092* (2013.01);
(Continued)

(58) Field of Classification Search
CPC ............... H01L 51/107; H01L 51/5231; H01L 51/5253
See application file for complete search history.

(56) References Cited

U.S. PATENT DOCUMENTS

| | | | | |
|---|---|---|---|---|
| 2003/0117066 A1* | 6/2003 | Silvernail | ........... | H01L 51/5237 313/504 |
| 2005/0275342 A1* | 12/2005 | Yanagawa | ............. | H01L 27/322 313/504 |

(Continued)

FOREIGN PATENT DOCUMENTS

| CN | 101197429 A | 6/2008 |
|---|---|---|
| CN | 102074659 A | 5/2011 |

(Continued)

OTHER PUBLICATIONS

Ted Pella, Inc., Hardness Tables, optained Mar. 20, 2018, pp. 1-3.*
Vortrag, "Lighting Japan 2013", Jan. 16-18, 2013, pp. 14-34.

*Primary Examiner* — Allan R Wilson
(74) *Attorney, Agent, or Firm* — McDermott Will & Emery LLP (57) ABSTRACT

The invention relates to an organic optoelectronic component comprising a substrate (101) on which a first electrode (102), then an organic functional layer stack (103) having at least one organic optoelectronic layer, and then a second electrode (104) are successively arranged. A thin film encapsulation (107) is arranged over the second electrode (104) and in addition to the second electrode (104), at least one first intermediate layer (121) having a hardness which is different from the layer which is directly adjacent thereto is arranged between the organic functional layer stack (103) and the thin-film encapsulation (107).

7 Claims, 6 Drawing Sheets

(52) U.S. Cl.
CPC ...... *H01L 51/5221* (2013.01); *H01L 51/5231* (2013.01); *H01L 2251/303* (2013.01); *H01L 2251/558* (2013.01)

(56) References Cited

U.S. PATENT DOCUMENTS

| | | | |
|---|---|---|---|
| 2007/0210705 A1* | 9/2007 | Yokoi | H01L 51/50 313/506 |
| 2008/0136320 A1 | 6/2008 | Choi | |
| 2008/0185960 A1* | 8/2008 | Koshiyama | H01L 51/524 313/512 |
| 2009/0059610 A1* | 3/2009 | Marshall | F21K 9/00 362/470 |
| 2011/0114973 A1 | 5/2011 | Matsuda | |
| 2011/0284898 A1 | 11/2011 | Iwasaki | |
| 2012/0126270 A1 | 5/2012 | Yamazaki et al. | |
| 2012/0175668 A1 | 7/2012 | Becker et al. | |
| 2013/0120227 A1* | 5/2013 | Tanikawa | G09G 3/00 345/55 |
| 2013/0126932 A1 | 5/2013 | Chen et al. | |
| 2013/0334511 A1* | 12/2013 | Savas | H01L 51/56 257/40 |
| 2014/0106111 A1* | 4/2014 | Nam | G03F 7/0755 428/76 |
| 2014/0210112 A1* | 7/2014 | Reusch | H01L 51/5253 257/790 |
| 2015/0034916 A1* | 2/2015 | Lee | H01L 51/5253 257/40 |
| 2017/0069876 A1* | 3/2017 | Popp | H01L 51/448 |

FOREIGN PATENT DOCUMENTS

| | | |
|---|---|---|
| DE | 10 2009 034 822 A1 | 2/2011 |
| WO | 2007/085494 A1 | 8/2007 |
| WO | 2009/095006 A1 | 8/2009 |
| WO | 2009/109183 A1 | 9/2009 |
| WO | 2010/066245 A1 | 6/2010 |
| WO | 2010/108894 A1 | 9/2010 |
| WO | 2012/151744 A1 | 11/2012 |
| WO | 2013/007592 A1 | 1/2013 |
| WO | 2013/076948 A1 | 5/2013 |
| WO | 2014/207039 A1 | 12/2014 |
| WO | 2015/000857 A1 | 1/2015 |
| WO | 2015/000859 A1 | 1/2015 |

* cited by examiner

ORGANIC OPTOELECTRONIC COMPONENT

An organic optoelectronic component is specified.

This patent application claims the priority of German Patent Application 10 2013 109 646.8, the disclosure content of which is hereby incorporated by reference.

Organic light emitting diodes, particularly if they are embodied as surface light sources, are highly susceptible to three-dimensional disturbances such as particles, for example.

At least one object of specific embodiments is to specify an organic optoelectronic component in which a susceptibility to particles is reduced.

This object is achieved by means of an article according to the independent patent claim. Advantageous embodiments and developments of the article are characterized in the dependent claims and are furthermore evident from the following description and the drawings.

In accordance with at least one embodiment, an organic optoelectronic component comprises on a substrate at least two electrodes, between which an organic functional layer stack having at least one organic optoelectronic layer is arranged. In particular, there are arranged on the substrate a first electrode, thereabove the organic functional layer stack and thereabove a second electrode.

Here and hereinafter, spatial indications such as, for instance, "on", "above", "thereabove", "below", "therebelow" relate to the customary order of arrangement of the layers on the substrate. If a first layer is arranged on or above a second layer, then this means that the second layer is arranged between the substrate and the first layer and the first layer is thus an overlying layer as viewed from the second layer. If a first layer is arranged below a second layer, then this means that the first layer is arranged between the substrate and the second layer, such that the first layer is an underlying layer as viewed from the second layer.

The organic optoelectronic component can be embodied for example as an organic light emitting component. In this case, the organic functional layer stack comprises, as at least one organic optoelectronic layer, at least one organic light emitting layer in the form of an organic electroluminescent layer that generates light during the operation of the organic light emitting component. At least one of the electrodes is translucent, such that the light generated during operation can be emitted through it outward to the surroundings. The organic light emitting component can be embodied in particular as an organic light emitting diode (OLED).

The organic optoelectronic component can alternatively or additionally also be embodied as an organic light detecting component. In this case, the organic functional layer stack comprises, as at least one organic optoelectronic layer, at least one organic light detecting layer that generates an electrical current and/or an electrical voltage upon light incidence during the operation of the organic light detecting component. At least one of the electrodes is translucent, such that ambient light from outside can pass through it to the organic functional layer stack. The organic light detecting component can be embodied in particular as an organic photodiode or an organic solar cell.

Here and hereinafter, "translucent" denotes a layer which is transmissive to visible light. In this case, the translucent layer can be transparent, that is to say clearly translucent, or at least partly light scattering and/or partly light absorbing, such that the translucent layer can for example also be diffusely or milkily translucent. Particularly preferably, a layer designated here as translucent is embodied such that it is as transparent as possible, with the result that, in particular, the absorption of light is as low as possible.

By way of example, a translucent electrode can comprise or be composed of a transparent conductive oxide (TCO) or a transparent metal. The other of the two electrodes between which the organic functional layer stack of the organic optoelectronic component is situated can be embodied as reflective and comprise or be composed of a metal, for example. As an alternative thereto, it is also possible for both electrodes to be embodied as translucent. In this case, the organic light emitting component can be embodied in particular as a transparent OLED.

In accordance with at least one further embodiment, the organic optoelectronic component comprises an encapsulation on the organic functional layer stack and the electrodes, that is to say above the second electrode. The encapsulation can particularly preferably be formed by a thin-film encapsulation comprising at least one or a plurality of thin layers that are applied by means of a deposition method, preferably by means of a chemical vapor deposition method, an atomic layer deposition method and/or a molecular layer deposition method, on the electrodes and the organic functional layer stack.

Furthermore, a cover adhesively bonded by means of an adhesive layer can be arranged on the encapsulation as viewed from the substrate, particularly in the case of a thin-film encapsulation, which cover can be formed for example by a glass layer or glass plate or else a plastic, a metal or a combination or a laminate of the materials mentioned. The cover, in particular in conjunction with an encapsulation embodied as a thin-film encapsulation, can serve as mechanical protection, in particular as anti-scratch protection, without the cover itself having to have an encapsulating effect.

It has been found that thin-film-encapsulated organic components having various layer sequences and a protective layer—for example in the form of a glass cover—laminated thereon may be particularly susceptible to three-dimensional disturbances such as particles, for instance, which are arranged between the top electrode and the cover. Such particles can be unintentionally applied to a layer in the form of contaminants during and between the production of the individual layers and can be covered with a subsequent layer. As a consequence, there may be an increased susceptibility to particles on account of the process implementation, for example if pressure is exerted on a location on or below which a particle is situated on a layer of the component. The transition from the top, second electrode to the thin-film encapsulation may be critical, for example, since a particle on the second electrode, which is usually formed from a soft material such as aluminum, for example, can be pressed into the organic layers by means of a layer of the thin-film encapsulation, which can usually be formed from a material having a great hardness such as silicon nitride, for example, which can lead to a spontaneous failure of the component as a result of a short circuit. Therefore, it is necessary to increase the robustness of organic optoelectronic components, in particular those embodied as surface light sources or surface light detectors, in order to reduce such a probability of spontaneous failure.

In this connection, one problem may be, in particular, that in preceding process steps for applying the various layers of the organic optoelectronic component, for example cleaning and mask changing steps, particles can be deposited particularly in the edge region of the layers. As a result of alignment inaccuracies often caused from a technical standpoint, it can additionally happen, for example, that the top, second electrode does not lie completely above the organic functional layer stack, with the result that at such locations particles can be pressed particularly readily into the organic functional layer stack.

Besides a high robustness, it may also be necessary for further specifications to be complied with. Inter alia, it may be necessary for one or more of the following boundary conditions with regard to the product specifications and process implementation to be taken into consideration and as far as possible at the same time fulfilled during the manufacture of an organic optoelectronic component:

optoelectronic (t0)-IVLS parameters such as voltage, luminance, efficiency, color coordinates;

lifetime, for example with regard to luminance, color shifts, voltage change;

shelf life;

robustness, for example with regard to spontaneous failures;

mechanical stability, for example with regard to layer detachments and thermal cycling durability;

design freedom;

particle-free process implementation, particularly if effects on the component are possible as a result of particles, in order to obtain a higher yield;

short process times and fast cycle times, as a result of which low unit costs and less material consumption can be achieved;

as little equipment or change of equipment as possible, which enables low capital expenditure.

The points presented above interact with one another and may conflict in some instances. By way of example, the shelf life can be significantly increased by an increase in the layer thickness of the thin-film encapsulation. Shelf lives can be specified by means of the parameters B10 and B50, for example, wherein B10 denotes 10% failure and B50 denotes 50% failure. In this regard, it has been found, for instance, that an average shelf life B50 of approximately 12 years can be achieved for example with a thin-film encapsulation having an 800 nm thick SiN layer, while approximately years as B50 can be achieved with an additional aluminum zinc oxide (ATO) layer having a thickness of nm. At the same time, however, the lifetime in operation can decrease as a result and/or the top electrode can be detached as a result of strain effects, as a result of which the mechanical stability of the component is adversely affected.

By way of example, the following measures for increasing the robustness are also known:

applying a thick layer by means of chemical vapor deposition (CVD) with a thickness of up to 5 μm: it is thereby possible to achieve a considerable increase in the B10 storage values in the case of particle-burdened processes in the EOL, according to estimates an increase of more than 200%. In this case, EOL denotes "end of line" and refers, for example, to processes concerning the encapsulation part. On account of a low process temperature required, however, long process times of the order of magnitude of approximately one hour are necessary. Furthermore, adverse effects on the lifetime and mechanical stability can arise on account of strains of the CVD layer.

Discretization of the luminous area and integration of integrated protection elements, as described for example in the document WO 2009/109183 A1: however, this necessitates a very high alignment accuracy, thus resulting in high capital expenditure in alignment units in the FOL. In this case, FOL denotes "front of line" and refers, for example, to processes concerning the substrate part.

High clean room quality: this results in a very high process engineering outlay and degree of automation on account of manufacture in clean rooms. Substrate cleanings and use of complex measuring methods in the case of cavity- and thin-film-encapsulated components result in high capital expenditure and maintenance costs.

Full automation of a process line in order to reduce the particle load: this also results in high capital expenditure.

Few different processes and few changes of equipment for particle reduction: such measures can mean that shelf life specifications are not fulfilled at least in some instances. By way of example, it has been found that a sufficiently impermeable SiN layer applied only by means of CVD and without a laminate layer deposited by means of atomic layer deposition (ALD) cannot be realized in a cost-effective, very short process time and thus with a small thickness at an allowed process temperature.

Cavity encapsulation instead of a thin-film encapsulation: a cavity encapsulation can prevent particles from being pressed in, to a certain extent, but getter materials generally have to be used in the case of cavity encapsulations, as a result of which high costs are caused, which can lead to yield problems.

Thick hole injection layers and/or hole injection layers applied wet-chemically increase the robustness, but limit the IVLS parameters. Generally, thick organic functional layers can also affect the lifetime and the performance and also the costs. After wet-chemical processes, a susceptibility to particles still remains on account of required changes of equipment.

Thin encapsulations with layer sequence structures such as are known from CVD processes, for example with $SiNCBO_x$ layer sequences in various embodiments or MLD structures (MLD: "molecular layer deposition"):

It has been found, for example, that layer structures composed of SiNC/SiNC are harder than the respective individual layers. It has also been found, however, that a sufficient shelf life cannot be produced in a reasonable process time solely with such layers despite the labyrinth effect brought about by the layer structures, which results in unacceptable costs. A lack of matching of the layer sequence structures to the underlying top electrode can additionally lead to layer detachments, which results in a reduced mechanical stability. Likewise, thick layers in the micrometers range can lead to detachment from the top electrode on account of the strains.

Use of ALD methods: layers applied by means of ALD foster the shelf life, but by themselves they do not increase the robustness. Furthermore, processes in the ALD method can have the effect of reducing the lifetime.

Glass lamination: Direct lamination of a glass cover increases the risk of particles being pressed into the organic layer stack.

Strained SiN thin-film encapsulation layers can increase the robustness, but tend toward detachment particularly in the case of an arrangement on Ag-based electrodes (particles are intended to be bent in one direction).

Small heights in multidimensional structures, for example composed of a resist, increase the probability of particles being pressed in or the resist being destroyed in a preceding cleaning process.

It has thus been found that although there are effective individual measures for increasing the robustness, these measures per se often have disadvantages such as, for instance, a reduction of the shelf life or an increase in the process costs.

In accordance with a further embodiment, the organic optoelectronic component comprises between the organic functional layer stack and the thin-film encapsulation in addition to the second electrode, at least one first intermediate layer having a different hardness than a directly adjacent layer. The at least one first intermediate layer can thus be arranged above or below the second electrode. Furthermore, also a plurality of first intermediate layers and/or in addition to the at least one first intermediate layer also at least one second intermediate layer can be present. If a plurality of intermediate layers are present, then they can be arranged above and/or below the second electrode between the organic functional layer stack and the thin-film encapsulation. The at least one first intermediate layer is constructed to protect the organic functional layer stack against damage as a result of dirt particles. In particular, the at least one first intermediate layer is constructed to protect the organic functional layer stack against damage as a result of those dirt particles situated between the second electrode and the thin-film encapsulation. If the organic optoelectronic component comprises a plurality of intermediate layers, then they can have in each case by themselves or else jointly the above-described protection mechanism against dirt particles situated between the second electrode and the thin-film encapsulation. Such dirt particles may be applied on the second electrode unintentionally during the manufacture of the organic optoelectronic component. This can take place during a change of equipment, mask change or process change, for example.

Dirt particles can have a variety of causes; by way of example, they can be dust particles that are present undesirably in equipment for producing at least one layer of the organic optoelectronic component. Furthermore, they can be particles that are detached from parts within coating equipment as a result of friction or abrasive processes. It can also be possible that coating materials deposit in coating equipment over time. If such deposits become too large, they can detach again in the form of particles, for example.

In conventional organic optoelectronic components, the dirt particles, if they deposit on the second electrode, in the event of pressure loading on the thin-film encapsulation, for example, can be pressed into the second electrode as a result of this since customary materials for the second electrode such as Al, Ag and Mg, for instance, are very soft. In the case of particles having a size of the order of magnitude of the thickness of the second electrode and/or of the thin-film encapsulation, that is to say in the case of particles having typical sizes of between 100 nm and 2 µm, there is the risk of these particles being pressed through the second electrode in the event of pressure loading. Such a three-dimensional disturbance can furthermore also be pressed through the organic layers as far as the first electrode situated at the bottom, which can result in a spontaneous failure of the organic optoelectronic component.

In the case of the organic optoelectronic component described here, the at least one first intermediate layer or else a plurality of first intermediate layers or else a combination of first and second intermediate layers are selected in a targeted manner with regard to the hardness thereof and the coefficient of thermal expansion thereof in order to prevent particles from being pressed into or through the second electrode in such a way. The intermediate layers described here and hereinafter can comprise metals, metal alloys, semiconductors, semiconductor mixtures and non-conductors and combinations thereof. The coefficients of thermal expansion of one or a plurality of intermediate layers are selected in such a way that detachment of layers applied above the organic system can be avoided.

Exemplary materials for an intermediate layer can be Al having a typical hardness of 23 to 45 HV10, Ag having a typical hardness of 43.7 HV10, Mg having a typical hardness of 37.7 HV10, Ga having a typical hardness of 18 HV10, In having a typical hardness of 14 HV10 and Zn having a typical hardness of 38 HV10. In this case HV10 denotes the Vickers hardness known to the person skilled in the art, that is to say the hardness which is measured with a test force of 10 kp during the hardness test according to Vickers. Intermediate layer materials having a hardness of less than or equal to 100 HV10 are referred to hereinafter as "soft".

Furthermore, an intermediate layer can comprise for example a material selected from Ni having a typical hardness of 114 HV10, Mo having a typical hardness of 350 HV10, Pd having a typical hardness of 475 HV10, Co having a typical hardness of 540 HV10, Rh having a typical hardness of 540 HV10, Ir having a typical hardness of 730 HV10, Ru having a typical hardness of 730 HV10, Ti having a typical hardness of 795 HV10 and Mn having a typical hardness of 795 HV10. Such materials having a hardness of between 100 and 1000 HV10 are referred to here and hereinafter also as "medium-hard".

Furthermore, an intermediate layer can also comprise a material selected from V having a typical hardness of 1120 HV10, Os having a typical hardness of 1120 HV10, Wo having a typical hardness of 1520 HV10 and Cr having a typical hardness of 1750 HV10. Such materials having a hardness of greater than or equal to 1000 HV10 are referred to here and hereinafter also as "hard".

Besides the soft, medium-hard and hard metals mentioned above, an intermediate layer can for example also comprise a ceramic material, for instance $Al_2O_3$ having a typical hardness of 1000 HV10, SiN having a typical hardness of 1600 HV10 and/or SiC having a typical hardness of 2600 HV10. In addition to such materials, for example SiOx, SiC, BC, BN, AlN, AlWN are also possible as ceramic intermediate layer materials.

In accordance with a further embodiment, the at least one first intermediate layer is arranged between the second electrode and the thin-film encapsulation. In this case, the at least one first intermediate layer has a lower hardness than an underlying layer directly adjoining the first intermediate layer, and than an overlying layer directly adjoining the first intermediate layer. In other words, the at least one first intermediate layer is situated between two layers of the organic optoelectronic component which have a greater hardness. The at least one first intermediate layer can have a thickness of greater than or equal to 200 nm, of greater than or equal to 300 nm, of greater than or equal to 500 nm, of greater than or equal to 1 µm or of greater than or equal to 2 µm, and of less than or equal to 10 µm or of less than or equal to 5 µm. In one preferred embodiment, the first intermediate layer has a thickness of greater than or equal to 2 µm and of less than or equal to 5 µm. In the case of such a thickness, what can be achieved in the case of a typical particle size that can be in the range of 100 nm to 10 µm is that particles applied in the region of the first intermediate layer unintentionally during manufacture are pressed into the first intermediate layer, without their being pressed through the second electrode.

In accordance with a further embodiment, the underlying layer directly adjoining the first intermediate layer is the second electrode. By way of example, the second electrode can comprise Al, Ag, Mg or a combination thereof, while the first intermediate layer comprises In, Ga, Zn or a combination thereof.

In accordance with a further embodiment, the underlying layer directly adjoining the first intermediate layer is a second intermediate layer, which is arranged on the second electrode and which has a greater hardness than the second electrode. By way of example, the second intermediate layer can be arranged directly on and in direct contact with the second electrode. Particularly preferably, such a second intermediate layer comprises a medium-hard or hard material, for example Cr, Wo, V, Os, Ru, Ir or a combination thereof. Furthermore, $AlO_x$, SiC, SiN or some other ceramic material having a greater hardness than the second electrode can be applied as the second intermediate layer. If, for example, Al is present in the second electrode or the second electrode is formed from Al, then $AlO_x$ can be produced on the second electrode by means of a direct oxidation of such an Al layer. In this case, a preferred layer thickness is greater than or equal to 1 nm and less than or equal to nm. Furthermore, it can also be possible that a ceramic layer, that is to say for example an $AlO_x$ layer or an SiC or SiN layer, is applied as the second intermediate layer by means of an ALD, MLD, sputtering or CVD process, preferably with a shadow mask identical to that used for applying the second electrode. It is also possible to apply layer sequences comprising a plurality of layers comprising different materials having the described properties as the first and/or second intermediate layer.

Particularly preferably, intermediate layers arranged above the second electrode are applied directly after the process for applying the second electrode or even within said process, with the result that as far as possible no particles can reach the second electrode. The intermediate layer materials, particularly in the case of metals, can be applied by vapor deposition, for example. Particularly preferably, in this case, identical shadow masks are used for producing the second electrode and at least the intermediate layer directly adjoining the second electrode. If particles are then applied unintentionally before or during the application of the thin-film encapsulation, then the second electrode is protected by the at least one first intermediate layer or a combination of the first and second intermediate layers.

In accordance with a further embodiment, the overlying layer directly adjoining the first intermediate layer is a layer of the thin-film encapsulation. In other words, the thin-film encapsulation directly adjoins the at least one first intermediate layer, such that the layer applied directly on the at least one first intermediate layer is a first encapsulation layer of the thin-film encapsulation.

In accordance with a further embodiment, the at least one first intermediate layer is arranged between the second electrode and the thin-film encapsulation, directly adjoins the second electrode and has a greater hardness than the second electrode. In particular, the at least one first intermediate layer in this embodiment can have features described above in association with the second intermediate layer.

In accordance with a further embodiment, the first intermediate layer has a lower hardness than a layer of the thin-film encapsulation that directly adjoins the first intermediate layer. In other words, the encapsulation layer of the thin-film encapsulation that directly adjoins the first intermediate layer is embodied as harder than the at least one first intermediate layer, which is in turn embodied as harder than the second electrode. Particles that are arranged on the first intermediate layer unintentionally for example during a process change for the deposition of the thin-film encapsulation are pressed into the first intermediate layer by the harder thin-film encapsulation. Particularly preferably, the first intermediate layer in this embodiment has a thickness as described further above in association with the first intermediate layer, which is softer than the second electrode, that is to say a thickness of greater than or equal to 200 nm and less than or equal to 10 μm and preferably of greater than or equal to 2 μm and less than or equal to 5 μm.

In accordance with a further embodiment, the second electrode comprises Al, Ag, Mg or a combination thereof and the first intermediate layer comprises Ni, Ti, V or a combination thereof.

In accordance with a further embodiment, the first intermediate layer has a greater hardness than a layer of the thin-film encapsulation that directly adjoins the first intermediate layer. In particular, the first intermediate layer in this embodiment can have a greater hardness than the entire thin-film encapsulation. Particles that are applied unintentionally after the application of the first intermediate layer and before or during the application of the thin-film encapsulation directly adjoining the first intermediate layer are pressed into the thin-film encapsulation in the event of pressure action. Particularly preferably the thin-film encapsulation in this case has a thickness as described further above in association with the first intermediate layer, which is softer than the second electrode, that is to say a thickness of greater than or equal to 200 nm and less than or equal to 10 μm.

In accordance with a further embodiment, the second electrode comprises Al, Ag, Mg or a combination thereof, while the first intermediate layer comprises Cr, Wo, V, Os, Ru, Ir or a combination thereof. Depending on the material which forms the first intermediate layer or which the first intermediate layer comprises, the thin-film encapsulation can comprise aluminum oxide, for example. With the use of Cr for the first intermediate layer, or an alloy comprising Cr which has a hardness of more than 1600 HV10, for example SiN or SiC or another of the ceramic materials mentioned above can also be selected for the thin-film encapsulation.

In accordance with a further embodiment, a second intermediate layer directly adjoining the first intermediate layer is arranged, between the first intermediate layer which has a greater hardness than the second electrode, and the thin-film encapsulation, wherein the first intermediate layer has a greater hardness than the second intermediate layer. The second intermediate layer can preferably have a lower hardness than the overlying layer which directly adjoins the second intermediate layer and which is formed by the thin-film encapsulation, for example. In this case, the second intermediate layer can have a lower hardness than the second electrode or a greater hardness than the second electrode. With the use of Al, Ag, Mg or a combination thereof for the second electrode, the second intermediate layer can comprise for example Al, Ag, Mg, In, Ga, Zn or a combination thereof. Particularly preferably, in this embodiment, a material identical to that chosen for the second electrode can be chosen for the second intermediate layer, such that the production of the second intermediate layer does not necessitate a process change in comparison with the application of the second electrode. The second intermediate layer in this embodiment can have a thickness as described further above for the first intermediate layer, which is softer than the second electrode, that is to say a thickness of greater than or equal to 200 nm and less than or equal to 10 μm.

In accordance with a further embodiment, at least one first intermediate layer is arranged on that side of the second electrode which faces the organic layer stack in a manner directly adjoining the second electrode and has a greater hardness than the second electrode. In this case, therefore, the first intermediate layer is arranged below the second electrode and above the organic functional layer stack.

In particular, the first intermediate layer in this embodiment can comprise an inorganic material.

In accordance with a further embodiment, the first intermediate layer is formed by an electrically insulating material and is embodied as a tunnel layer between the organic functional layer stack and the second electrode for electrical charge carriers. In particular, the first intermediate layer for this purpose can have a thickness of greater than or equal to 1 nm or of greater than or equal to 2 nm, and of less than or equal to 5 nm or of less than or equal to nm. On account of such a small thickness for the first intermediate layer, the latter preferably comprises a hard material. By way of example, the second electrode can comprise aluminum, while the first intermediate layer comprises aluminum oxide. In order to produce such a first intermediate layer between the organic functional layer stack and the second electrode, a thin aluminum layer can be applied on the organic functional layer stack, said aluminum layer being directly oxidized by the supply of oxygen. Such an aluminum layer can have a thickness of, for example, 1 to 5 nm and preferably 2 to 3 nm. In particular, the amount of oxygen supplied is precisely enough that the applied aluminum layer oxidizes through at least partly or wholly. Afterward, aluminum can be applied further without the addition of oxygen, in order to form the second electrode.

As an alternative thereto, it can also be possible to apply the at least one first intermediate layer between the organic functional layer stack and the second electrode by means of ALD or MLD. In this case, a ceramic material, for example a material composed of the material system SiNCOB, can preferably be selected, that is to say for example one or a plurality of materials selected from silicon nitride, silicon oxide, silicon carbide, boron carbide, boron nitride, aluminum nitride, aluminum oxide, aluminum tungsten oxide.

In accordance with a further embodiment, an intermediate layer, for example at least one first intermediate layer, is applied on the second electrode and completely covers the second electrode. That means, in other words, that the at least one first intermediate layer overlaps the second electrode. Furthermore, a second intermediate layer can be applied on the at least one first intermediate layer, which completely covers and overlaps the at least one first intermediate layer. As an alternative thereto, it is also possible for a first intermediate layer to be applied on a second intermediate layer on the second electrode, and for the first intermediate layer to completely cover and overlap the second intermediate layer. Furthermore, it is also possible for the thin-film encapsulation to completely cover and overlap the at least one first intermediate layer and/or the at least one second intermediate layer and the second electrode. In particular, it is particularly advantageous if each of the layers applied on the organic functional layer stack completely covers and overlaps the respective underlying layer. By virtue of the layer that is respectively arranged above the layers being shaped around said layers in this way, particle protection is also ensured in lateral edge regions of the layers. In particular, such a layer structure can increase the robustness of the organic optoelectronic component even at the edge, such that spontaneous failures as a result of particles that are applied unintentionally in particular in edge regions of the organic functional layer stack do not lead to spontaneous failures. The robustness of the organic optoelectronic component can thus be increased, without deterioration of other significant parameters such as, for instance, the lifetime, the shelf life and the other parameters mentioned above.

Such a complete coverage or overlap of layers on the organic functional layer stack is advantageous particularly in combination with the intermediate layers described above. Corresponding shaping-around can be achieved for example by the use of a stepped mask for applying the layers, said stepped mask covering the edge region of the already applied layers from the substrate to a certain degree, and by the use of evaporation sources for the individual materials used for the corresponding layers which have different opening angles.

In the case of the organic optoelectronic component described here, with the aid of the at least one first intermediate layer or else a plurality of first intermediate layers or else additionally at least one second intermediate layer, the robustness can be increased in comparison with organic optoelectronic components without such intermediate layers. What can be achieved in addition to increasing the robustness is that at the same time other significant boundary conditions in the product properties such as, for example, the IVLS parameters, for instance luminance, efficiency, voltage and color, the lifetime, the shelf life, the mechanical susceptibility and the design freedom in conjunction with at the same time a tenable budget and manufacturing time frame are not adversely affected. Furthermore, the process costs can be kept low.

By means of a suitable alternation of hard and soft layers in the region of the second electrode below the thin-film encapsulation, which prevents the penetration of particles into the organic functional layer stack and respectively yields to hard particles, the robustness can be increased without the impermeable properties of the thin-film encapsulation being reduced at the same time.

Likewise, the above-described targeted application of the second electrode, of the one or more intermediate layers and of the thin-film encapsulation above the respective underlying layer in such a way that the latter is completely covered leads to an increase in robustness with respect to spontaneous failure with the use of hitherto customary process systems without deterioration in the other parameters.

The use of equipment used hitherto, such as thermal evaporators, CVD equipment and ALD equipment, for instance, is possible on account of the measures described here. In this case, easy incorporation of the measures described here into previous processes without mechanical separation of the substrate from a shadow mask used can be possible, which can lead to a significant reduction of the particle loading. The reproducibility can be increased by means of a defined layer surface without random variation, it being possible to reduce the clean room quality and the general particle purity in the equipment used, with a possibly positive effect on costs.

Furthermore, it can be possible at the same time to directly adapt the degrees of hardness and the coefficients of expansion of the top, second electrode and of the thin-film encapsulation for example by alloying and/or adapted thin-film layers, which can lead to a reduction of the probability of detachment of the top electrode.

Further advantages, advantageous embodiments and developments will become apparent from the exemplary embodiments described below in association with the figures.

In the figure:

FIG. 1B shows an excerpt from FIG. 1A, FIGS. 2A and 2B show schematic illustrations of excerpts from an organic optoelectronic component in accordance with further exemplary embodiments.

In the exemplary embodiments and figures, elements that are identical, of identical type or act identically may be provided with the same reference signs in each case. The illustrated elements and their zide relationships among one another should not be regarded as true to scale; moreover, individual elements such as, for example, layers, structural parts, components and regions may be illustrated with exaggerated size in order to enable better illustration and/or in order to afford a better understanding.

Figure 1A:
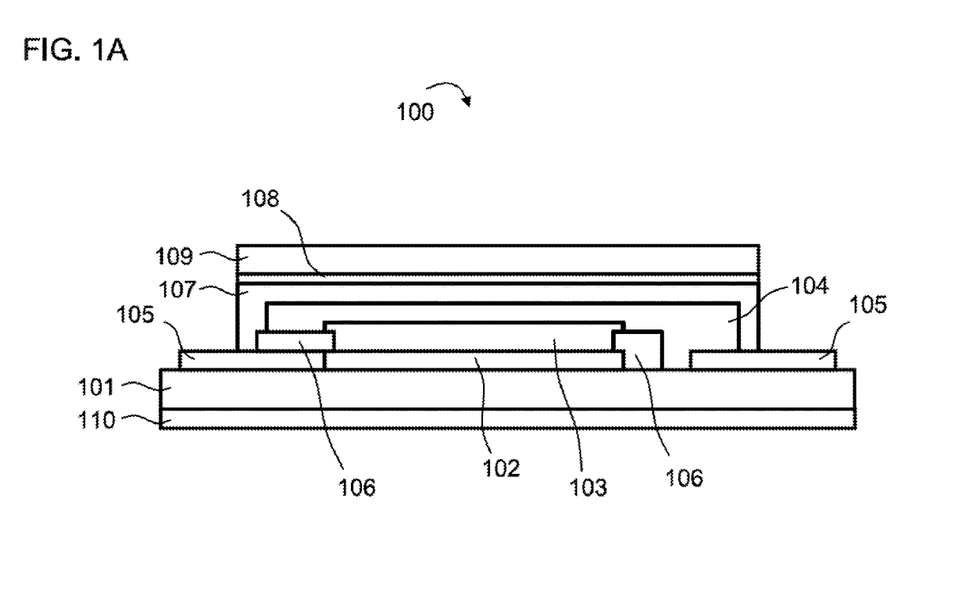
FIG. 1A shows a schematic illustration of an organic optoelectronic component in accordance with one exemplary embodiment.

FIG. 1A shows an organic optoelectronic component 100 in accordance with one exemplary embodiment, which is embodied purely by way of example as an organic light emitting component in the form of an organic light emitting diode (OLED). Alternatively or additionally, the organic optoelectronic component can also be embodied as an organic light detecting component.

The organic optoelectronic component 100 comprises a substrate 101, on which an organic functional layer stack 103 having at least one organic light emitting layer is arranged between a first electrode 102 and a second electrode 104. At least one of the electrodes 102, 104 is embodied as translucent and thus transmissive to light, such that light generated in the organic functional layer stack 103 during the operation of the component 100 can be radiated through the at least one translucent electrode.

In the case of the organic optoelectronic component 100 shown in FIG. 1, the substrate 101 is embodied as translucent, for example in the form of a glass plate or glass layer. As an alternative thereto, the substrate 101 can for example also comprise a translucent plastic or a glass-plastic laminate.

The first electrode 102 applied on the substrate 101 is likewise embodied as translucent and comprises a transparent conductive oxide, for example. Transparent conductive oxides (TCOs) are transparent conductive materials, generally metal oxides, such as, for example zinc oxide, tin oxide, cadmium oxide, titanium oxide, indium oxide and indium tin oxide (ITO). Alongside binary metal-oxygen compounds, such as, for example $ZnO$, $SnO_2$ or $In_2O_3$, ternary metal-oxygen compounds, such as, for example, $Zn_2SnO_4$, $CdSnO_3$, $ZnSnO_3$, $MgIn_2O_4$, $GaInO_3$, $Zn_2In_2O_5$ or $In_4Sn_3O_{12}$, or mixtures of different transparent conductive oxides also belong to the group of TCOs. Furthermore, the TCOs do not necessarily correspond to a stoichiometric composition and can also be p- or n-doped. Furthermore, a translucent electrode can for example also comprise a transparent metal, metallic network structures or conductive networks, for example comprising or composed of silver, and/or graphene or carbon-containing layers or a combination of the transparent materials mentioned.

In the exemplary embodiment shown, the second electrode 104 applied on the organic functional layer stack 103 is embodied as reflective and comprises a metal that can be selected from aluminum, barium, indium, silver, gold, magnesium, copper, calcium and lithium and compounds, combinations and alloys thereof. In particular, the electrode 104 can comprise Ag, Al, Mg or alloys or layer stacks comprising these, for example Ag/Mg, Ag/Ca, Mg/Al or Mo/Al/Mo or Cr/Al/Cr. Alternatively or additionally, the electrode 104 can also comprise a TCO material mentioned above or a layer stack comprising at least one TCO and at least one metal.

In the exemplary embodiment shown, the bottom electrode 102 is embodied as an anode, while the top electrode 104 is embodied as a cathode. Given corresponding material selection, however, a construction that is reversed with respect to polarity is also possible.

The electrodes 102, 104 can be embodied with a large area in a continuous fashion, such that the organic optoelectronic component 100 can be shaped as a luminous source, in particular as a surface light source. In this case, with a large area can mean that the organic optoelectronic component 100 has an area of greater than or equal to a few square millimeters, preferably greater than or equal to one square centimeter, and particularly preferably greater than or equal to one square decimeter.

Furthermore, one or both electrodes 102, 104 can be structured and have regions that are drivable and contactable in a manner electrically isolated from one another. By way of example, regions having shapes selected in a targeted manner can be present which allow the representation of figures or pictograms. Furthermore, the electrodes 102, 104 can for example also be structured in each case in a strip-shaped fashion with electrode strips arranged alongside one another, wherein the electrode strips of one of the electrodes 102, 104 run perpendicularly to the electrode strips of the other of the electrodes 102, 104. In this case, the intersection regions of the electrode strips of the two electrodes 102, 104 can form pixels, such that the organic optoelectronic component 100 can also be embodied as a display device, that is to say as a display, for example. Furthermore, it is also possible for one of the electrodes 102, 104 to have a pixel-like structuring, while the other of the electrodes 102, 104 can be structured with a large area or likewise in a pixel-like fashion.

For electrically contacting the electrodes 102 and 104 as is shown in FIG. 1A, electrode connection pieces 105 are provided which extend away from the respectively contacted electrode 102, 104 on the substrate 101 and extend through below the encapsulation 107 (described further below), from the electrodes 102, 104 toward the outside. Depending on the emission direction of the OLED 100, the electrode connection pieces 105 embodied as electrical contact feeds can be embodied as transparent or non transparent and comprise or be composed of a TCO and/or a metal, for example. By way of example, the electrode connection pieces 105 can be formed by a metal layer or a metal layer stack, for example Mo/Al/Mo, Cr/Al/Cr or Al. It can also be possible for at least one or a plurality of the electrode connection pieces 105 to comprise the same material as the electrode 102, 104 to be respectively contacted. In this case, an electrode and an electrode connection piece contacting the electrode can also be embodied integrally.

In addition to the at least one organic light emitting layer, the organic functional layer stack 103 can comprise further organic layers suitable for conducting holes or electrons to the at least one organic light emitting layer or for blocking the respective transport, for example one or more selected from hole injection layers, hole transport layers, electron blocking layers, hole blocking layers, electron transport layers, electron injection layers and charge generation layers (CGLs). Furthermore, a plurality of organic light emitting layers can also be present. The layers of the organic functional layer stack 103 can comprise organic polymers, organic oligomers, organic monomers, organic small, non-polymeric molecules ("small molecules") or combinations thereof. In particular, it can be advantageous if the organic functional layer stack 103 comprises a functional layer embodied as a hole transport layer in order to enable an effective hole injection into the at least one organic light emitting layer. By way of example tertiary amines, carbazole derivatives, conductive polyanaline or polyethylene dioxy-thiophene may prove to be advantageous as materials for a hole transport layer. Suitable materials for the at least one light emitting layer are electroluminescent materials having radiation emission on account of fluorescence or phosphorescence, for example polyfluorene, polythiophene or polyphenylene or derivatives, compounds, mixtures or copolymers thereof.

Furthermore, as is shown in FIG. 1A, insulator layers 106 can be present, for example comprising or composed of polyimide, which can electrically insulate for example the electrodes 102, 104 from one another. Depending on the configuration of the individual layers of the organic optoelectronic component 100, insulator layers 106 need not actually be absolutely necessary and can be absent, for instance in corresponding mask processes for applying the layers.

A thin-film encapsulation 107 for protecting the organic functional layer stack 103 and the electrodes 102, 104 is arranged above the organic functional layer stack 103 and the electrodes 102, 104. In the present case, an encapsulation embodied as a thin-film encapsulation is understood to mean a device suitable for forming a barrier with respect to atmospheric substances, in particular with respect to moisture and oxygen, and/or with respect to further damaging substances such as, for instance, corrosive gases, for example hydrogen sulfide. In other words, the thin-film encapsulation 107 is embodied in such a way that at most very small proportions of atmospheric substances can penetrate through it. In the case of the thin-film encapsulation 107 this barrier effect is substantially produced by barrier layers and/or passivation layers which are embodied as thin layers and which are part of the encapsulation. The layers of the thin-film encapsulation 107 generally have a thickness of less than or equal to a few 100 nm. In particular, the thin-film encapsulation 107 can comprise or consist of thin layers which are responsible for the barrier effect of the encapsulation. The thin layers can be applied for example by means of an atomic layer deposition (ALD) method or molecular layer deposition (MLD) method. Suitable materials for the layers of the encapsulation arrangement are, for example, silicon oxide, silicon nitride, silicon oxynitride, silicon carbide, aluminum oxide and also zinc oxide, zirconium oxide, titanium oxide, hafnium oxide, lanthanum oxide, tantalum oxide, and TCOs mentioned above in association with the translucent electrode, for example aluminum tin oxide and aluminum zinc oxide. Preferably, the thin-film encapsulation 107 comprises a layer sequence comprising a plurality of the thin layers each having a thickness of between one atomic layer and a few hundred nm.

As an alternative or in addition to thin layers produced by ALD or MLD, the encapsulation can comprise at least one or a plurality of further layers, that is to say in particular barrier layers and/or passivation layers, which are deposited by thermal vapor deposition or by means of a plasma aided process, for instance sputtering, chemical vapor deposition (CVD) or plasma-enhanced chemical vapor deposition (PECVD). Suitable materials therefor may be the above-mentioned materials, in particular silicon nitride, silicon oxide, silicon oxynitride, indium tin oxide, indium zinc oxide, aluminum-doped zinc oxide, aluminum oxide and mixtures and alloys of the materials mentioned. The one or the plurality of further layers can for example in each case have a thickness of between 1 nm and 5 µm, and preferably between 1 nm and 400 nm, inclusive of the limits. Thin-film encapsulations are described for example, in the documents WO 2009/095006 A1 and WO 2010/108894 A1, the respective disclosure content of which in this regard in its full scope is hereby incorporated by reference.

Furthermore, a cover 109 adhesively bonded by means of an adhesive layer 108, for example a lamination adhesive, can be arranged on the encapsulation 107 as viewed from the substrate 101, as is shown in FIG. 1A. The cover 109 can be formed for example by a glass layer or glass plate or else a plastic, a metal or a combination or a laminate of the materials mentioned and, particularly in conjunction with an encapsulation 107 embodied as a thin-film encapsulation, can serve as mechanical protection, in particular as anti-scratch protection, without the cover 109 itself having to have an encapsulating effect. Additionally or alternatively, a protective lacquer, for example in the form of a spray lacquer, can also be applied on the encapsulation 107.

The organic optoelectronic component 100 is embodied as a so-called bottom emitter on account of the translucent substrate 101 and the translucent bottom first electrode 102 and emits light through the translucent electrode 102 and the translucent substrate 101 during operation. In order to improve the coupling-out of light, an optical coupling-out layer 110 embodied for example as a scattering layer comprising scattering particles in a transparent matrix and/or having a light-scattering surface structure can be arranged on that side of the substrate 101 which faces away from the organic functional layer stack 103. Alternatively or additionally, a coupling-out layer can also be arranged for example between the substrate 101 and the bottom first electrode 102, arranged on the substrate 101, or between other functional layers in the form of an internal coupling-out layer.

As an alternative to the bottom emitter configuration described, the top second electrode 104 arranged in a manner facing away from the substrate 101 can also be embodied as translucent in order that the light generated in the organic functional layer stack 103 during operation is emitted through the top electrode 104 in a direction facing away from the substrate 101. In this case, the organic light emitting component 100 is embodied as a so-called top emitter. The bottom electrode 102 arranged between the substrate 101 and the organic functional layer stack 103 can also be embodied as reflective, if no light emission through the substrate 101 is desired. In this case, the substrate 101 can likewise comprise a nontransparent material, for example a nontransparent glass, a nontransparent plastic, a metal or combinations thereof. In addition to the top electrode 104, the further layers arranged thereabove are also embodied as light-transmissive in the top emitter configuration. Furthermore, in this case, a coupling-out layer can be arranged above the top electrode 104, for example on the cover 109 or between the cover 109 and the encapsulation 107.

Furthermore, the organic optoelectronic component 100 can also be embodied simultaneously as a bottom emitter and as a top emitter and thus preferably as a transparent OLED and have a combination of the features respectively mentioned in association with the bottom and top emitter configurations.

With regard to further features of the organic optoelectronic component 100, for example with regard to the construction, the layer composition and the materials of the organic functional layer stack, of the electrodes and of the encapsulation, reference is made to the document WO 2010/066245 A1, which, in regard to the construction of an organic optoelectronic component and also with regard to modifications and variations of the organic light emitting component shown in FIG. 1, is hereby expressly incorporated by reference.

Figure 1B:
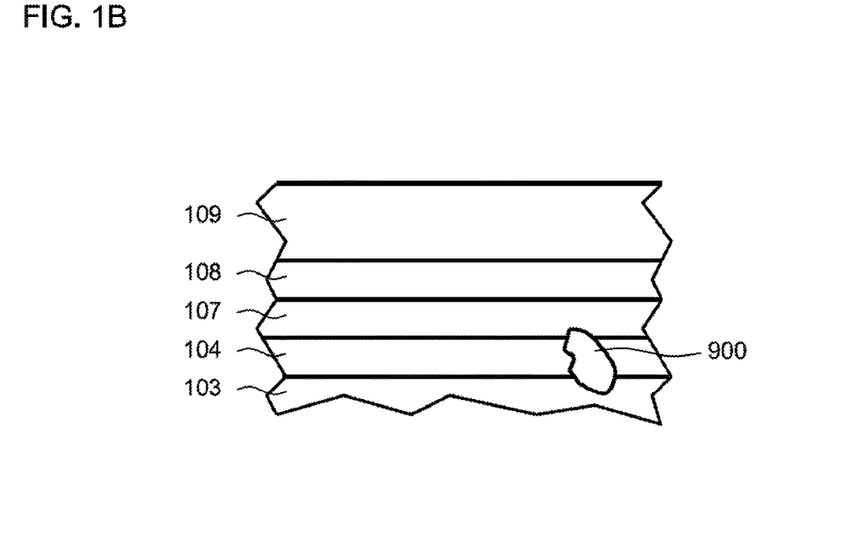

FIG. 1B shows an excerpt from the organic optoelectronic component from FIG. 1A that shows a part of the organic functional layer stack 103 with the above-described layers arranged thereabove. As a result of a process change and/or change of equipment after the application of the second electrode 104 on the organic functional layer stack 103 for the purpose of applying the thin-film encapsulation 107, particles such as the particles 900, shown by way of example may be applied to the second electrode 104 in an undesired manner.

The dirt particle 900 may be formed for example by a dust particle, by abraded material of a part of the coating equipment, composed of material that deposited on parts of the coating equipment as a result of previous application processes and crumbled away again, and composed of similar material. Customary particle sizes are typically in the range of 100 nm to 2 µm. During the deposition of the thin-film encapsulation 107, such unintentionally deposited particles, such as the particle 900 shown by way of example, are at least partly encapsulated. Since the second electrode 104, as described above, comprises or is formed from, for example Al, Ag, Mg or other soft metals, in the event of pressure loading on the thin-film encapsulation 107, which, on account of its construction from ceramic layers, is considerably harder than the second electrode 104, the particle 900 can be pressed into or even through the second electrode 104 into the organic functional layer stack 103. This disturbance can also be pressed through the organic layers of the organic functional layer stack 103 as far as the underlying first electrode 102, which could result in a short circuit and thus a spontaneous failure of the organic functional component.

In association with the subsequent figures, proceeding from the description above, exemplary embodiments are described in which damage as a result of dirt particles can be at least reduced or even prevented. Although the exemplary embodiment in FIGS. 1A and 1B relates to an organic optoelectronic component embodied as an organic light emitting component, the following description also holds true for organic optoelectronic components embodied as organic light detecting components.

In order to obtain protection of the organic functional layer stack 103 against particles pressed through the second electrode 104, between the organic functional layer stack 103 and the thin-film encapsulation 107 in addition to the second electrode 104, at least one first intermediate layer 121 is arranged having a different hardness than a directly adjacent layer. As described in the general part, the at least one first intermediate layer 121 is constructed to protect the organic functional layer stack 103 against damage as a result of particles 900, in particular those situated between the second electrode 104 and the thin-film encapsulation 107.

Metals, metal alloys, semiconductor materials, semiconductor mixtures, electrically insulating materials and combinations thereof can be used for the intermediate layers described below. Particularly preferably, metals or ceramic materials are used as intermediate layer materials. It is particularly advantageous if at least one intermediate layer is arranged in direct contact with the second electrode. The intermediate layers described below are chosen with regard to their materials in such a way that they have the below-described hardness properties in conjunction with a sufficient adhesion and suitable coefficients of expansion. A strain matching may furthermore also be possible as a result of a suitable selection of the intermediate layer materials.

Figure 2A:
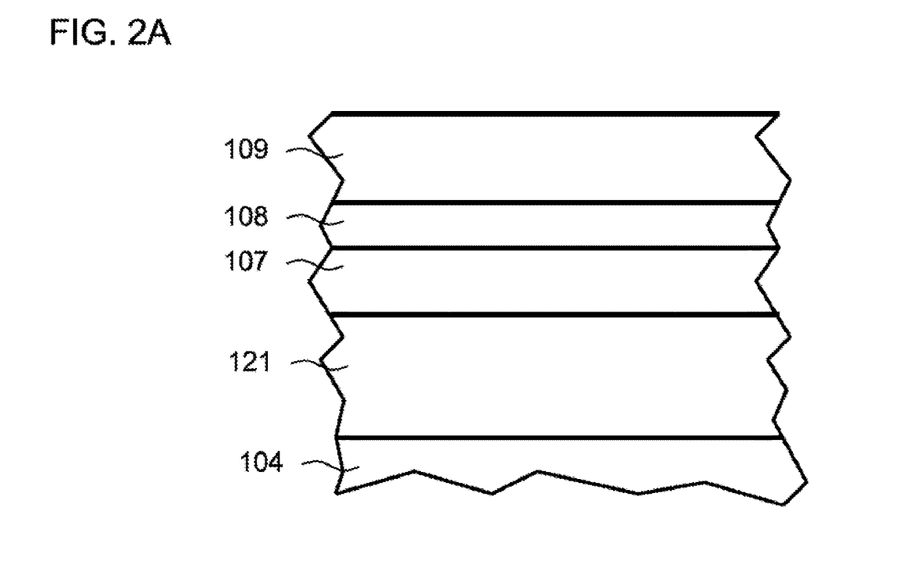
Figure 2B:
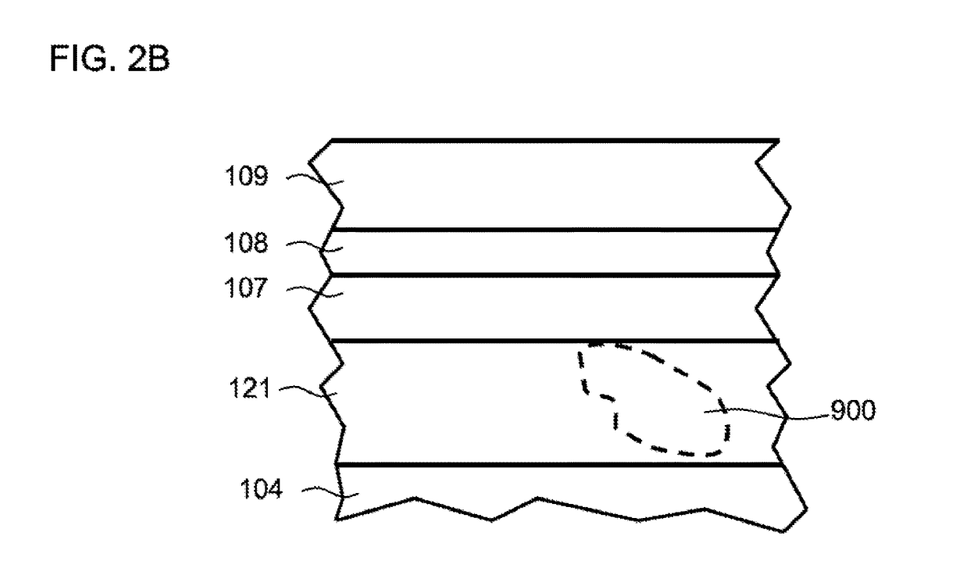

FIG. 2A shows an exemplary embodiment in which there is arranged between the second electrode 104 and the thin-film encapsulation 107 at least one first intermediate layer 121 having a lower hardness than an underlying layer directly adjoining the at least one first intermediate layer 121 and than an overlying layer directly adjoining the at least one first intermediate layer 121. FIG. 2B shows the same exemplary embodiment, wherein a dirt particle 900 is indicated which can be unintentionally incorporated between the second electrode 104 and the thin-film encapsulation 107 and which as described in association with FIG. 1B, without the intermediate layers described below, at least in the event of pressure loading on the thin-film encapsulation 107, can lead to damage to the second electrode 104 and the organic functional layer stack 103 arranged underneath.

In the exemplary embodiment shown in FIGS. 2A and 2B, the underlying layer directly adjoining the first intermediate layer 121 is formed by the second electrode 104, while the overlying layer directly adjoining the first intermediate layer 121 is formed by the thin-film encapsulation 107. If the thin-film encapsulation 107 comprises a plurality of encapsulation layers, at least that encapsulation layer which directly adjoins the first intermediate layer is embodied such that it is harder than the first intermediate layer 121. Particularly preferably, all the encapsulation layers are embodied such that they are harder than the first intermediate layer 121. The thin-film encapsulation can comprise one of the abovementioned materials, for example, SiN, SiC and/or AlO$_x$.

If the second electrode comprises, for example, Al, Ag, Mg or a combination thereof, the first intermediate layer 121 can comprise, for example, softer metals such as In, Ga, Zn or combinations thereof. The first intermediate layer 121 has a thickness that is greater than or equal to the particle size to be expected. In the case of particle sizes of 100 nm to 10 µm, it is particularly advantageous if the first intermediate layer 121 has a thickness of greater than or equal to 200 nm or even greater than or equal to 300 nm or greater than or equal to 500 nm or greater than or equal to 1 µm or greater than or equal to 2 µm. Furthermore, the thickness of the intermediate layer 121 can be less than or equal to 5 µm or less than or equal to 10 µm. Such thicknesses make it possible that dirt particles 900, as is indicated in FIG. 2B, which are unintentionally arranged on the second electrode 104, in the event of pressure loading on the significantly harder thin-film encapsulation 107, are pressed into the first intermediate layer 121. This prevents the dirt particles from being pressed into or even through the second electrode 104.

In order to achieve the lowest possible susceptibility to particles during the application of the first intermediate layer 121, the latter is preferably applied using the same mask that is also used for applying the second electrode. One exemplary method therefor is described further below in association with FIGS. 8 and 9.

As an alternative to a first intermediate layer 121 which is softer than the second electrode 104 and the thin-film encapsulation 107, a first intermediate layer 121 having a greater hardness than the second electrode 104 and a lower hardness than the thin-film encapsulation 107 can also be provided between the second electrode 104 and the thin-film encapsulation 107. If the second electrode 104 comprises, for example, Al, Ag, Mg or combinations thereof or it is composed of such materials, the first intermediate layer 121 can comprise, for example Ni, Ti, V or a combination thereof. Preferably, the first intermediate layer 121 in this case has a thickness as described further above for the softer materials.

Figure 3:
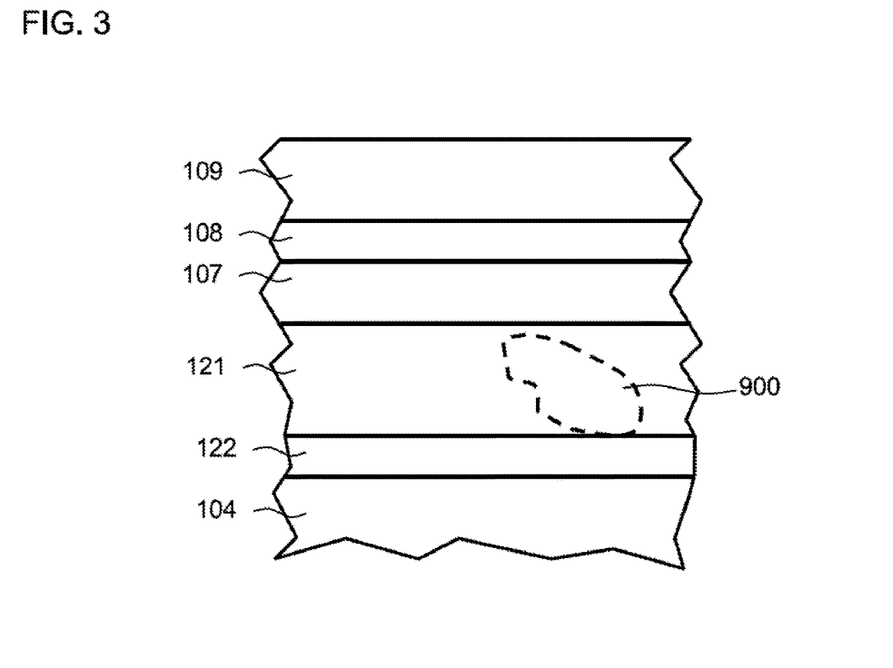
FIGS. 3 to 6 show schematic illustrations of excerpts from organic light emitting components in accordance with further exemplary embodiments.

FIG. 3 shows a further exemplary embodiment, additionally comprising a second intermediate layer 122 in comparison with the previous exemplary embodiment. The second intermediate layer 122 forms the underlying layer directly adjoining the first intermediate layer 121 and has a greater hardness than the second electrode 104 and thus also than the first intermediate layer 121. In particular, the second intermediate layer 122 is applied in direct contact directly on the first electrode 104.

The second intermediate layer 122 can have a thickness that is significantly smaller than the thickness of the first intermediate layer 121. Particles 900 which are applied unintentionally and before the application of the thin-film encapsulation 107 for example after the application of the intermediate layer system comprising the intermediate layers 121 and 122 can be pressed into the first intermediate layer 121 in the event of pressure loading on the thin-film encapsulation 107. On account of the harder second intermediate layer 122, however, said particles are not pressed through the second intermediate layer 122.

The second intermediate layer 122 can comprise for example a metal, in particular a hard metal such as, for instance Cr, Wo, V, Os, Ru, Ir or a combination thereof. As already mentioned in association with the previous exemplary embodiment, the second intermediate layer 122 is preferably applied using the same shadow mask as the second electrode 104, such that particle loading as a result of a shadow mask change can be precluded.

As an alternative thereto, the second intermediate layer 122 can for example also comprise a ceramic material applied for example by means of an ALD, MLD or CVD process; by way of example, the second intermediate layer 122 can comprise for this purpose $AlO_x$ applied by means of ALD or SiC and/or SiN applied by means of CVD. Furthermore, other materials from the material system SiNCOB are also possible for the second intermediate layer 122. Layer combinations of a plurality of ceramic and/or metallic materials are also possible for the second intermediate layer 122. If the second electrode 104 comprises aluminum or if it is formed from aluminum, the second intermediate layer 122 can also be produced by direct oxidation of the top side of the second electrode 104. For this purpose, oxygen is supplied during or after the process for applying the second electrode 104, such that an aluminum layer having a layer thickness in the range of 1 to 10 nm can oxidize and forms the second intermediate layer 122.

Figure 4:
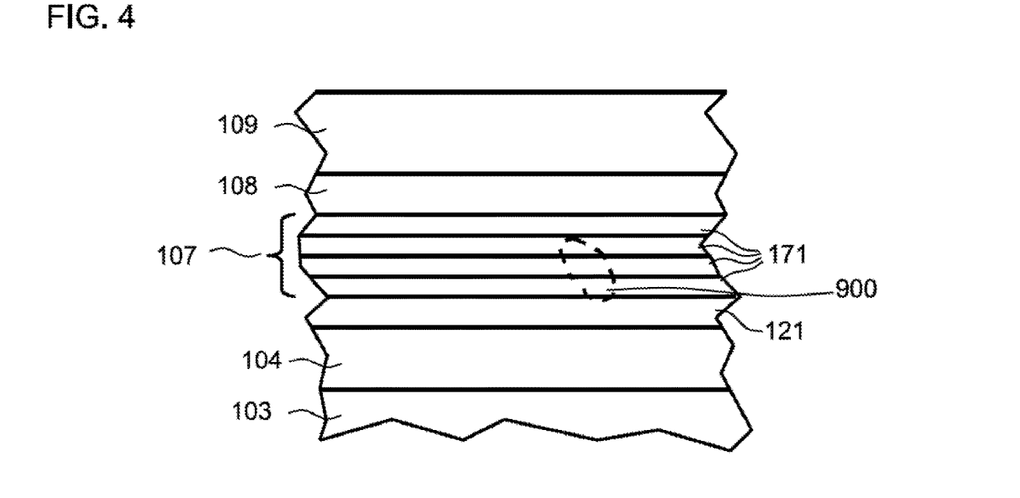

FIG. 4 shows a further exemplary embodiment, in which a first intermediate layer 121 having a greater hardness than the second electrode 104 and than the thin-film encapsulation 107 is provided between the second electrode 104 and the thin-film encapsulation 107 in a manner directly adjoining them. In particular, the first intermediate layer has a greater hardness than that encapsulation layer 171 of the thin-film encapsulation 107 which directly adjoins the first intermediate layer 121. Particularly preferably, the first intermediate layer 121 is harder than all of the encapsulation layers 171 of the thin-film encapsulation 107.

The hard first intermediate layer 121 can comprise a material as described for the second intermediate layer 122 in accordance with the previous exemplary embodiment. Furthermore, the first intermediate layer 121 of the exemplary embodiment in FIG. 4 can be applied by a corresponding method described above. Particles 900 that are unintentionally deposited on the first intermediate layer 121 after the application thereof are pressed into the thin-film encapsulation 107 in the event of pressure action, such that the second electrode 104 is protected by the hard first intermediate layer 121. For this purpose, the thin-film encapsulation 107 preferably has a layer structure applied by means of ALD, MLD, CVD or sputtering and having a thickness that is greater than or equal to the particle size to be expected. In particular, the thin-film encapsulation can have a thickness as described above for the first intermediate layer 121. What can thereby be achieved is that the thin-film encapsulation 107 still remains impermeable even in the case of particles 900 pressed in.

Figure 5:
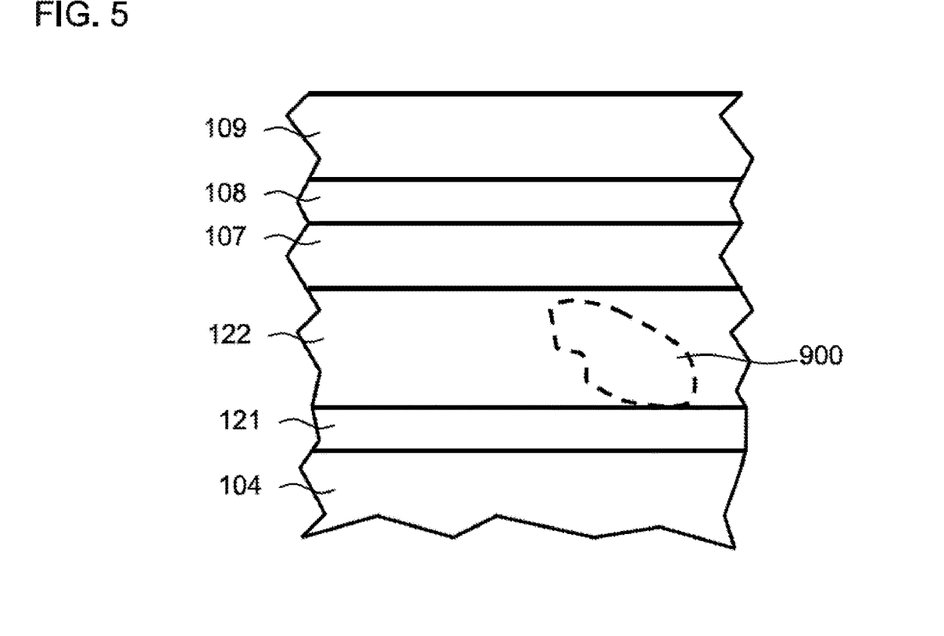

FIG. 5 shows a further exemplary embodiment, in which, in addition to the hard first intermediate layer 121 in accordance with the previous exemplary embodiment, there is applied thereon a second intermediate layer 122 having a lower hardness than the first intermediate layer 121. The second intermediate layer 122 can comprise for example a material that is softer than the second electrode 104. In this case, the exemplary embodiment in FIG. 5 corresponds to the exemplary embodiment in FIG. 3, the first and second intermediate layers being interchanged with regard to their designation.

Furthermore, it may also be possible for the second intermediate layer 122 in the exemplary embodiment in FIG. 5 to comprise a material having the same hardness as, or a greater hardness than the second electrode 104. Since the second intermediate layer 122 is still softer than the first intermediate layer 121, particles 900 are pressed into it in the event of pressure loading, without the second electrode 104 being damaged. By way of example, the first intermediate layer 121 can comprise a hard material mentioned above in the general part, while the second intermediate layer 122 comprises a medium-hard material. A higher resistance during pressing-in with respect to particles 900 can be achieved by the use of a medium-hard material instead of a soft material. It may also be particularly advantageous if an identical material is used for the second electrode 104 and the second intermediate layers 122. If the second electrode is formed from a material that comprises or is composed of Ag, Al, Mg or a combination thereof, then Ag, Al, Mg or a combination thereof can correspondingly likewise be used for the second intermediate layer 122.

Figure 6:
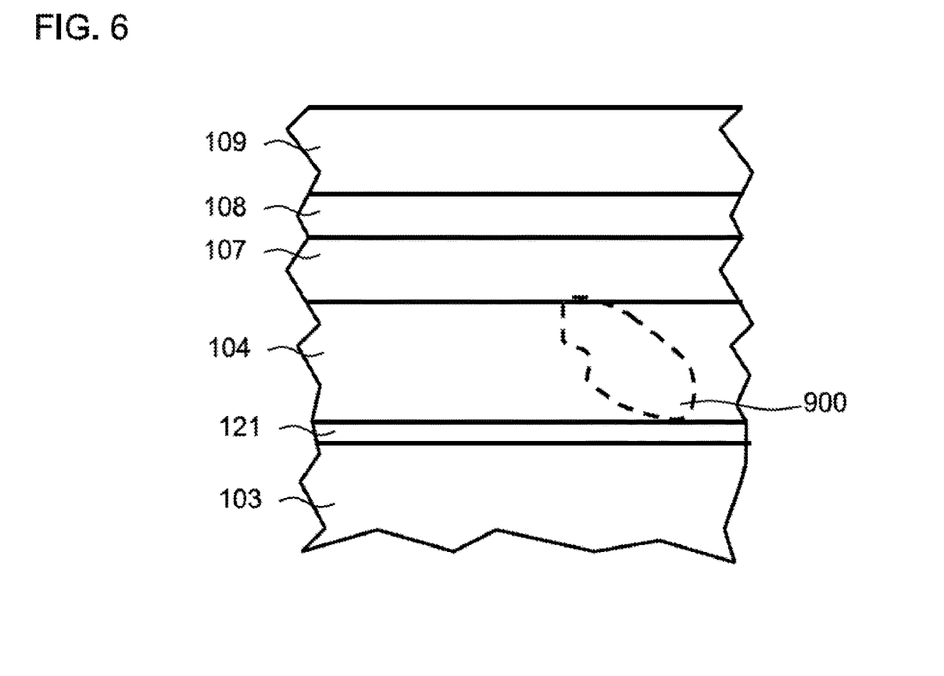

FIG. 6 shows a further exemplary embodiment, in which, in comparison with the previous exemplary embodiments, at least one first intermediate layer 121 is arranged between the organic functional layer stack 103 and the second electrode 104. The first intermediate layer 121 has a greater hardness than the second electrode 104. What can be achieved thereby is that particles which are applied unintentionally on the second electrode 104, in the event of pressure loading on the thin-film encapsulation 107, are indeed pressed through the second electrode 104, but the organic functional layer stack 103 is protected by the first intermediate layer 121.

In particular, the first intermediate layer 121, as in the previous exemplary embodiments, can be composed of an inorganic material. By way of example, the first intermediate layer 121 can be formed by an electrically insulting material and can be embodied as a tunnel layer for electrical charge carriers. In this case, the first intermediate layer has a thickness of greater than or equal to 1 nm and less than or equal to 5 nm, particularly preferably approximately 2 to 3 nm. The production of the first intermediate layer 121 can be carried out like the production of the first intermediate layer 121 of the exemplary embodiment in FIG. 4. In particular, direct oxidation of a thin Al layer is possible, on which further aluminum is applied for producing the second electrode 104. As an alternative thereto, the material for the first intermediate layer 121 can be applied by means of ALD, MLD or CVD, for example, and comprise a material from the material system SiNCOB. By way of example, the first intermediate layer can comprise one or a plurality of materials selected from silicon nitride, silicon oxide, silicon carbide, boron carbide, boron nitride, aluminum nitride, aluminum oxide, aluminum tungsten nitride.

The first intermediate layer 121 can also be formed as a layer structure having a plurality of layers applied by means of ALD or MLD, for example.

Figure 7A:
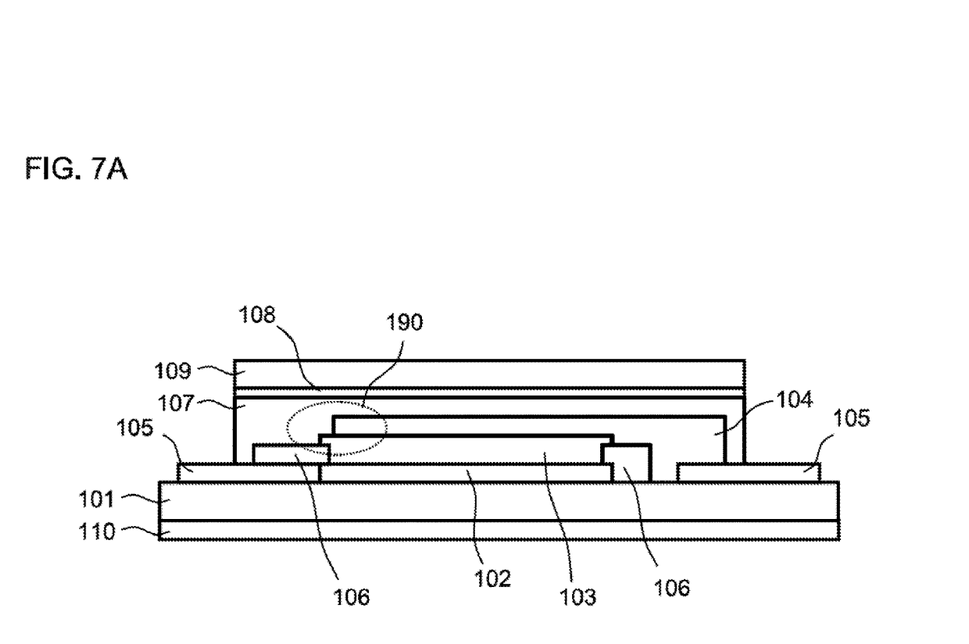
FIGS. 7A and 7B show schematic illustrations of an organic optoelectronic component in accordance with a further exemplary embodiment.
Figure 7B:
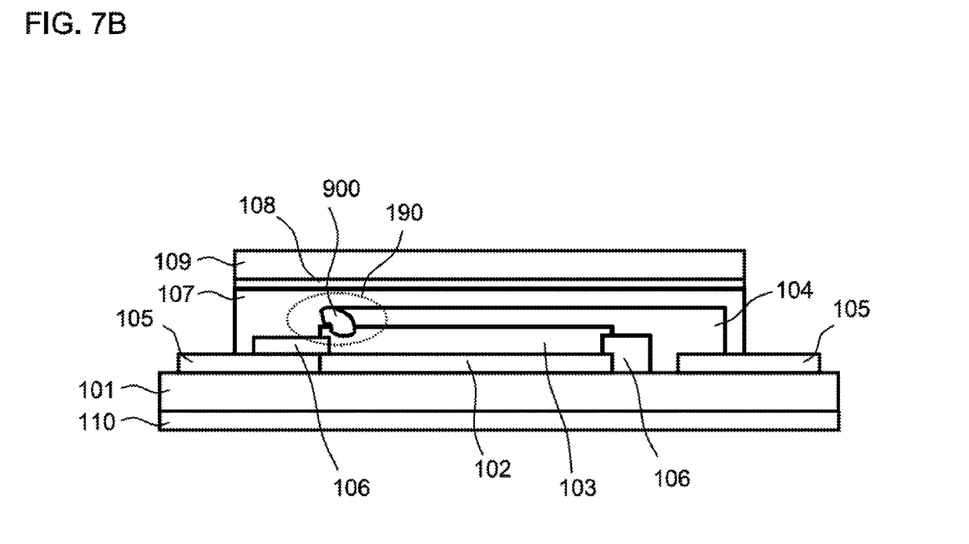

FIG. 7A shows an organic optoelectronic component embodied like the organic optoelectronic component 100 in accordance with the exemplary embodiment in FIG. 1A. In comparison with the ideal case shown in FIG. 1A, in which the second electrode 104 completely covers the organic functional layer stack 103, FIG. 7A shows a typical non-ideal organic optoelectronic component, in which the second electrode 104 does not completely cover the organic functional layer stack 103 on account of predefined tolerances during layer application. In particular, edge regions such as the edge region 190 shown by way of example are jeopardized here. As is shown in FIG. 7B, particularly in such edge regions 190, particles 900 can be pressed more easily into the soft organic functional layer stack 103, which can easily lead to spontaneous failures.

Figure 8:
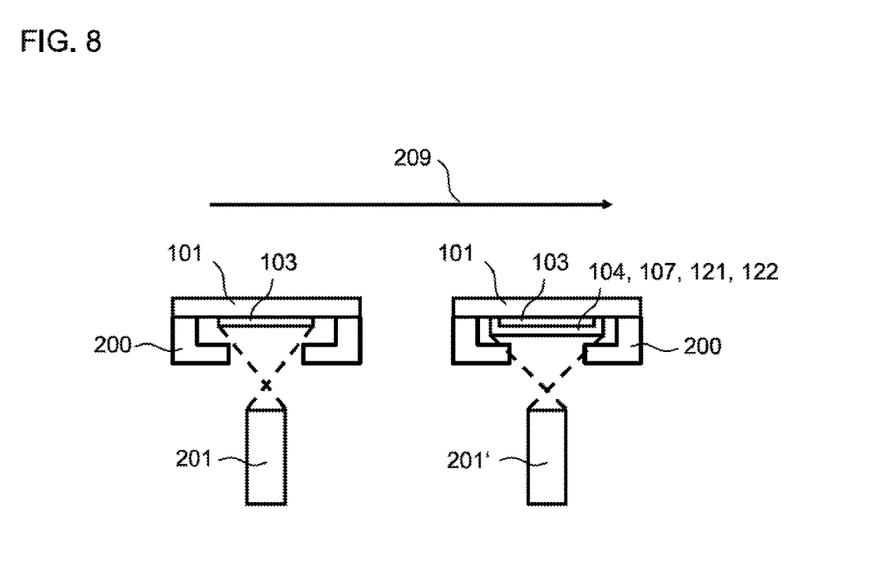
FIG. 8 shows a schematic illustration of a method for producing an organic optoelectronic component in accordance with a further exemplary embodiment.

In order to obtain as comprehensive protection as possible of the organic functional layer stack 103, FIG. 8 shows a method in which it is possible to avoid such tolerances in the processes for applying the layers above the organic functional layer stack 103 and which simultaneously results in a minimization of the particle loading. FIG. 8 shows to that end purely by way of example a method by which a second electrode 104 on a substrate 101 is completely covered with a further layer applied thereon, said further layer being formed by a thin-film encapsulation 107 or an intermediate layer 121, 122. The further layers of the organic optoelectronic component such as, for instance, the first electrode 102, the organic functional layer stack 103 and the further layers shown by way of example in FIG. 1A are not shown in FIG. 8, for the sake of simplicity.

FIG. 8 shows two substrates 101 of a series of substrates which are transported along a transport direction 209 past evaporator sources 201, 201'. A plurality of evaporator sources can also be provided in each case. A respective shadow mask 200 is applied above the substrates 101, said shadow mask being embodied as a stepped mask, such that in particular the edge regions of the layer to be applied are produced by vapor deposition under the stepped mask.

The dashed lines indicate the respective opening angle of the evaporator sources 201, 201'. If the opening angle of the evaporator sources 201, 201' is chosen differently, in particular if the opening angle of an evaporator source 201' later in the process is greater than the opening angle of an evaporator source 201 earlier in the process, then what can be achieved is that greater vapor deposition under the stepped mask 200 is brought about in the case of the later evaporator 201'. As is indicated in FIG. 8, what is achieved as a result is that the layer 107, 121, 122 applied on the second electrode 104 completely covers the latter. The setting of the different opening angles can be achieved for example by means of a corresponding hole pattern in the case of linear sources known to a person skilled in the art. On account of the use of different evaporator sources having different opening angles, advantageously the same shadow mask 200 can be used in the different application steps. As little particle loading as possible is thereby achieved since the substrates 101 with the layers applied thereon merely have to be transported from one evaporator source to the next evaporator source.

Figure 9:
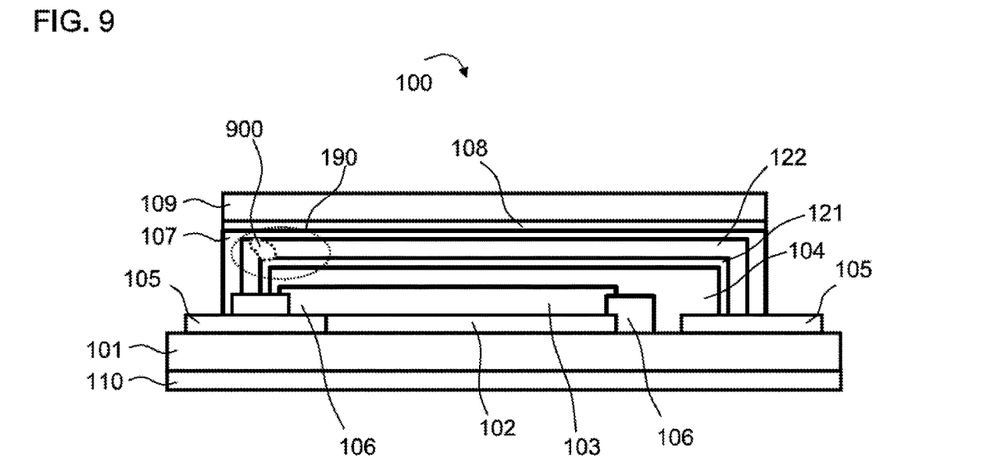
FIG. 9 shows a schematic illustration of an organic optoelectronic component in accordance with a further exemplary embodiment.

FIG. 9 shows a corresponding organic optoelectronic component 100 having a layer construction as described in association with FIGS. 1A and 5, that is to say comprising a first and a second intermediate layer 121, 122 between the second electrode 104 and the thin-film encapsulation 107. The method described above makes it possible to apply the individual layers above the organic functional layer stack 103 in a plurality of successive steps in such a way that each of said layers completely covers the respective underlying layer. Therefore, in contrast to the description in association with FIGS. 7A and 7B, the particle 900 indicated in the edge region cannot lead to damage to the organic functional layer stack 103.

The features and exemplary embodiments described in association with the figures can be combined with one another in accordance with further exemplary embodiments, even if such combinations are not explicitly described with the individual figures. Furthermore, the exemplary embodiments shown in the figures can have further or alternative features in accordance with the general description.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. An organic optoelectronic component, comprising:
   a substrate, on which a first electrode, thereabove an organic functional layer stack having at least one organic optoelectronic layer, and thereabove a second electrode are arranged;
   above the second electrode a thin-film encapsulation; and
   between the organic functional layer stack and the thin-film encapsulation in addition to the second electrode at least one first intermediate layer having a different hardness than a directly adjacent layer,
   wherein the thin-film encapsulation comprises one or more thin layers applied by at least one of chemical vapor deposition, atomic layer deposition or molecular layer deposition, and
   wherein the thin-film encapsulation is configured to form a barrier with respect to at least one of moisture, oxygen or corrosive gas, wherein the at least one first intermediate layer is arranged between the second electrode and the thin-film encapsulation, wherein the at least one first intermediate layer directly adjoins the second electrode and has a greater hardness than the second electrode, and wherein the at least one first intermediate layer has a lower hardness than a layer of the thin-film encapsulation that directly adjoins the at least one first intermediate layer.

2. The organic optoelectronic component according to claim 1, wherein the at least one first intermediate layer is constructed to protect the organic functional layer stack against damage as a result of dirt particles, in particular dirt particles situated between the second electrode and the thin-film encapsulation.

3. The organic optoelectronic component according to claim 1, wherein the second electrode comprises Al, Ag, Mg or a combination thereof and the first intermediate layer comprises Cr, Wo, V, Os, Ru, Ir or a combination thereof.

4. The organic optoelectronic component according to claim 1, wherein a second intermediate layer directly adjoining the first intermediate layer is arranged between the first intermediate layer and the thin-film encapsulation, and the first intermediate layer has a greater hardness than the second intermediate layer.

5. The organic optoelectronic component according to claim 1, wherein the at least one first intermediate layer completely covers the second electrode.

6. An organic optoelectronic component comprising:
a substrate, on which a first electrode, thereabove an organic functional layer stack having at least one organic optoelectronic layer, and thereabove a second electrode are arranged;
above the second electrode a thin-film encapsulation; and
between the organic functional layer stack and the thin-film encapsulation in addition to the second electrode at least one first intermediate layer having a different hardness than a directly adjacent layer,
wherein the at least one first intermediate layer is arranged between the second electrode and the thin-film encapsulation,
wherein the at least one first intermediate layer directly adjoins the second electrode and has a greater hardness than the second electrode, and
wherein the first intermediate layer has a lower hardness than a layer of the thin-film encapsulation that directly adjoins the first intermediate layer.

7. An organic optoelectronic component comprising:
a substrate, on which a first electrode, thereabove an organic functional layer stack having at least one organic optoelectronic layer, and thereabove a second electrode are arranged;
above the second electrode a thin-film encapsulation; and
between the organic functional layer stack and the thin-film encapsulation in addition to the second electrode at least one first intermediate layer having a different hardness than a directly adjacent layer,
wherein the at least one first intermediate layer is arranged between the second electrode and the thin-film encapsulation,
wherein the at least one first intermediate layer directly adjoins the second electrode and has a greater hardness than the second electrode,
wherein the first intermediate layer has a lower hardness than a layer of the thin-film encapsulation that directly adjoins the first intermediate layer, and
wherein the second electrode comprises Al, Ag, Mg or a combination thereof and the first intermediate layer comprises Ni, Ti, V or a combination thereof.

* * * * *